United States Patent
Fischer et al.

(10) Patent No.: US 6,677,629 B1
(45) Date of Patent: Jan. 13, 2004

(54) ELECTRIC OR ELECTRONIC COMPONENT AND APPLICATION AS NON VOLATILE MEMORY AND DEVICE WITH SURFACE ACOUSTIC WAVES

(75) Inventors: Oystein Fischer, Coppet (CH); Jean-Marc Triscone, Plan-les-Ouates (CH); Charles H. Ahn, Geneva (CH); Malcom R. Beasley, Palo Alto, CA (US); Christophe Renner, Grand-Lancy (CH); Thomas Tybell, Geneva (CH)

(73) Assignee: Universite de Geneve, Geneva (CH)

( * ) Notice: Subject to any disclaimer, the term of this patent is extended or adjusted under 35 U.S.C. 154(b) by 0 days.

(21) Appl. No.: 09/402,195

(22) PCT Filed: Apr. 1, 1998

(86) PCT No.: PCT/CH98/00123
§ 371 (c)(1),
(2), (4) Date: Nov. 30, 1999

(87) PCT Pub. No.: WO98/44498
PCT Pub. Date: Oct. 8, 1998

(30) Foreign Application Priority Data

Apr. 1, 1997 (FR) .............................................. 97 04298

(51) Int. Cl.⁷ .................. H01L 29/76; H01L 29/82; H01L 21/00
(52) U.S. Cl. ................ 257/295; 257/415; 257/416; 438/3; 438/50; 369/126
(58) Field of Search ............................... 257/295, 415, 257/416; 369/126; 438/3, 50, 52

(56) References Cited

U.S. PATENT DOCUMENTS

| | | | |
|---|---|---|---|
| 2,922,986 A | 1/1960 | Chynoweth | 340/173 |
| 3,170,083 A | 2/1965 | Newberry | 315/31 |
| 4,389,445 A | 6/1983 | Yoshida et al. | 310/311 |
| 4,410,823 A | 10/1983 | Miller et al. | 310/313 D |
| 4,731,754 A | 3/1988 | Ogden et al. | 365/121 |
| 5,155,658 A * | 10/1992 | Inam et al. | 361/321 |
| 5,168,420 A | 12/1992 | Ramesh et al. | 361/321 |
| 5,206,525 A | 4/1993 | Yamamoto et al. | 257/40 |
| 5,216,631 A | 6/1993 | Sliwa, Jr. | 365/174 |
| 5,371,729 A * | 12/1994 | Yamamoto et al. | 369/126 |
| 5,384,797 A | 1/1995 | Welch et al. | 372/23 |
| 5,472,935 A | 12/1995 | Yandrofski et al. | 333/161 |
| 5,481,527 A | 1/1996 | Kasanuki et al. | 369/126 |
| 5,732,177 A | 3/1998 | Deacon et al. | 385/122 |

FOREIGN PATENT DOCUMENTS

| | | |
|---|---|---|
| EP | 0 275 881 A2 | 7/1988 |
| JP | 07-335 772 A * | 12/1995 |
| WO | WO 93/21637 | 10/1993 |

OTHER PUBLICATIONS

Japanese Abstract, Vol 006, No 088 (P–118) dated May 26, 1998; JP 57–024044A to Toshiba Corp.
Japanese Abstract, Vol 006, No 092 (P–119) dated May 29, 1982; JP 57–027447 A to Toshiba Corp.
Japanese Abstract, Vol 096, No 004 dated Apr. 30, 1996; JP 07–335772 A to Hitachi Ltd.

* cited by examiner

Primary Examiner—Tom Thomas
Assistant Examiner—Donghee Kang
(74) Attorney, Agent, or Firm—Davis and Bujold, P.L.L.C.

(57) ABSTRACT

The invention concerns a component of composite structure (10) consisting of a layer of ferroelectric material (11) and at least a thin film of semiconductor material or of a thin metal or superconducting film (12) in close contact with the layer of ferroelectric material (11). It further comprises means for generating local modifications of the ferroelectric material polarization. This mechanism includes a device for applying a voltage between at least one punctiform electrode (13) arranged for selectively scanning the composite structure (10) surface facing that consisting of the semiconductor or thin metal or superconducting film (12), and the semiconductor or thin metal or superconducting film.

20 Claims, 2 Drawing Sheets

ELECTRIC OR ELECTRONIC COMPONENT AND APPLICATION AS NON VOLATILE MEMORY AND DEVICE WITH SURFACE ACOUSTIC WAVES

FIELD OF THE INVENTION

The present invention concerns an electric or electronic component, particularly an electric or electronic circuit or a non-volatile memory.

It also concerns the application of such a component as a non-volatile memory and as a device with acoustic surface waves.

BACKGROUND OF THE INVENTION

During the last decade, rapid progress has been made in the deposition of films with composite epitaxial, oxide-base structures, laying the groundwork for subsequent advancement in the field of copper oxide superconductors and allowing preparation of epitaxial films of materials such as magnetoresistant manganese oxides. One of the numerous other families of materials recently formed using this epitaxial approach is ferroelectric oxide. One attractive quality of these materials is their reversible, non-volatile polarization field. In addition, numerous devices with electric field effects have been developed, ranging from dynamic random access memories (DRAMs) to nanosystem models such as dual dimension electronic gases.

All these devices require the use of permanent metal electrodes to produce and maintain the electrical field, which poses a major problem because very delicate lithography is required to manufacture the metal electrodes.

U.S. Pat. No. 5,206,525 describes a device essentially equivalent to a field effect transistor with the dielectric replaced by a pi-conjugated macromolecular material mixed with a ferroelectric material. The goal of this invention is to modify conductivity using the electrical field. However, this device cannot modify local electronic properties.

U.S. Pat. No. 5,371,729 describes a data storage device based on the principle of locally commutating the polarization of a ferroelectric film deposited on a semi-conductor. The aim of this invention is to increase working speed by using high voltage current to generate an avalanche phenomena.

European Patent Application published as No. EP-O 275 881 describes a device which uses a tunnel effect microscope to read and write data on an electrically polarized film, which is primarily a polymer. The purpose of this device is not to write data using electrical impulses or to read data by detecting local modifications in electronic density.

The present invention proposes a novel electric or electronic component which either simplifies both the permanent electrodes and the customary lithography manufacturing process, or renders them completely superfluous. In addition, the method of making this component is non-invasive.

This goal is achieved by the component according to the invention, characterized in that is comprises a composite structure consisting of least one layer of ferroelectric material and at least one semi-conductor or a thin film of a metal or superconductor material, in close contact with at least one surface of said layer of ferroelectric material, as well as means for generating local polarization modifications in said ferroelectric layer either to cause local modifications, on a scale ranging from nanometers to micrometers, in the electronic density of one zone on said semi-conductor or of the thin metal film or of the superconductor, said zone being close to said surface of said ferroelectric layer; or to use a piezoelectric effect to create a local deformation in said layer of ferroelectric material, depending upon the polarization value, in order to generate an acoustic surface wave.

SUMMARY OF THE INVENTION

According to its preferred embodiments, said means for generating local polarization modifications in said layer of ferroelectric material may comprise a device for applying current between at least one selective electrode, designed to selectively scan the surface of said composite structure opposite the surface consisting of the semi-conductor or thin film of metal or superconductor material, and said semi-conductor or thin film of metal or superconductor material.

According to an advantageous embodiment, said composite structure may consist of a semi-conductor or a thin film of metal or superconductor material in close contact with a first surface of said layer of ferroelectric material, and a very thin film of semi-conductor, metal, or superconductor material in close contact with a second surface of the layer of ferroelectric material which is opposite said first surface of the layer of ferroelectric material.

According to this embodiment, the surface of the composite structure that is scanned or swept by a selective electrode is the very thin semi-conductor, metal, or superconductor film which is in close contact with the second surface layer of ferroelectric material, with current being applied between said selective electrode and said very thin film. Current may also be applied between the electrode and the semi-conductor or the thin film of metal or superconductor material in close contact with the first surface of said layer of ferroelectric material. In both these cases, it is possible to apply current simultaneously between said very thin semi-conductor, metal or superconductor film and the semi-conductor or the thin film of metal or superconductor.

Advantageously, said selective electrode may consist of the tip of a microscope with a local sensor. It may also consist of a source of particles.

According to a first embodiment, said particle source is designed to generate an electron beam.

According to a second embodiment, said source of particles is designed to generate an ion beam.

In a variation, said selective electrode may consist of a radiation source.

In a particularly advantageous embodiment, the polarization of said layer of ferroelectric material is represented by a characteristic that is sensitive to local modifications in the electronic density of said semi-conductor or in the thin film of metal or superconductor material.

Preferably, said characteristic is the tunnel conductance between a local wave scanning the surface of the composite structure opposite the surface constituting the semi-conductor or the thin film of metal or superconductor material, and said semi-conductor or thin film or metal or superconductor material.

One of the particularly advantageous applications of the component is in the formation of an acoustic surface wave device, specifically, a filter for frequencies typically ranging up to 20 GHz and higher.

Another application of the component is to use it as an electronic circuit, particularly as a non-volatile memory.

BRIEF DESCRIPTION OF THE DRAWINGS

The present invention will be more readily understood from the following description of a preferred embodiment of the component according to the invention and its variations, with reference to the drawings, in which.

DETAILED DESCRIPTION OF THE INVENTION

Figure 1:
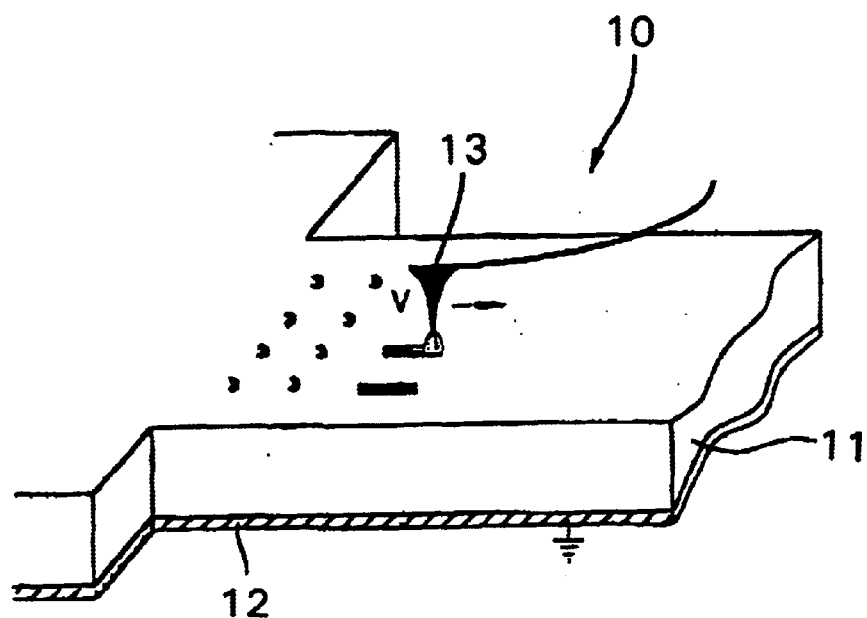
FIGS. 1 and 2 are schematic perspectives showing two modes of the electric or electronic component of the invention.

The component of the invention as shown in FIG. 1 consists primarily of a composite structure 10 comprising a layer of ferroelectric material 11 in the form of a film, and a semi-conductor or a film of metal or superconductor material 12, in close contact with one of the surfaces of the layer of ferroelectric material 11. Moreover, the component comprises a means of generating local polarization modifications in the layer of ferroelectric material 11. The objective is to modify electronic density locally in one zone of said semi-conductor or said thin film of metal or superconductor material 12 near the surface of the layer of ferroelectric material 11, or to create a local deformation in the layer of ferroelectric material in order to generate an acoustic surface wave.

Said means consists of a device for applying current between said semi-conductor or the thin film of metal or superconductor material 12 and at least one selective electrode 13 designed to selectively scan the surface of said layer of ferroelectric material 11 opposite the surface supporting thin film 12. Said selective electrode may consist, for example, of the tip of a microscope with a local sensor. It may also consist of a particle source. Said particle source may generate either an electron beam or an ion beam. It may also consist of a radiation source.

In a first particularly advantageous application of the invention, the component is used to write an electrical circuit. According to a second application, the component is used to make data storage devices. Writing takes place on the nanometer scale with the tip of a microscope having a local sensor, which serves as a selective electrode or a particle source causing local modifications in the polarity of the ferroelectric material. The polarity (±) of the material in the ferroelectric layer modifies the electronic density of the metal or of the semi-conductor near the surface, and this modification defines the electronic circuit or storage device.

To achieve this, in an ideal context, an atomic force microscope (AFM) with a conductive tip scans the surface of the composite structure, known as the ferroelectric epitaxial heterostructure, which in this case consists of the following materials—Pb(ZrO.52 TiO.48)O3 (PZT)/ SrRuO3—while current is applied between the tip and the semiconductor or the film of metal or superconductor material. When the electric field between the tip and the conductor film is larger than the coercive field in the layer of ferroelectric material 11, the polarization in this layer fluctuates locally below the tip and causes a flux of charges in the screen in the layer of metal or semi-conductor material, thus modifying the total density of the carriers and consequently the resistance of the conductor, which can be measured using standard techniques for measuring electronic transport. In an ideal context, the semi-conductor or the thin metal or superconductor film has a low carrier density and an electric or electronic characteristic that is sensitive to changes in the density of an electronic state.

Figure 2:
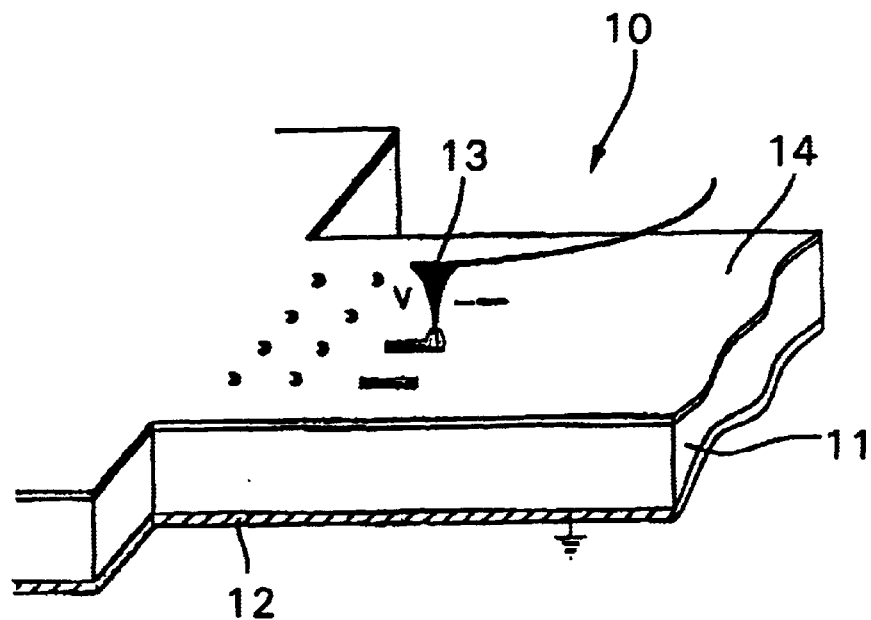

According to a second advantageous embodiment, shown in FIG. 2, structure 10 is completed by a semi-conductor, metal, or superconductor material 14, deposited on the second surface of the layer of ferroelectric material 11 opposite thin film 12. Said material is preferably in the form of a very thin film in close contact with ferroelectric material 11. It may be in the form of a continuous film or it may consist of islands. Said film constitutes both a means of applying current to the layer of ferroelectric material 11 in combination with thin film 12 and a means of passivating the surface of polarized ferroelectric material.

The means for generating local polarization modifications consists of a device for applying current between at least one selective electrode 13, designed to selectively scan the layer of ferroelectric material 11 or the film 14, and said very thin film 14 or said thin film 12. Current may also be simultaneously applied between said very thin film 14 and said thin film 12. The ferroelectric material can be polarized by applying current impulses to the selective electrode, possibly in the presence of current passing through the layer of ferroelectric material of lower strength then the coercive current.

This component permits the non-invasive establishment of a local field effect, while also creating electronic nano-structures without electrical contacts made using conventional lithograph methods. This approach is of interest because it offers a completely novel perspective on the manufacture of field-effect devices and small electronic structures. The ability to change domains vertically using a nearby microscope to produce an electronic contrast that is not susceptible to passivation is especially advantageous.

The principal advantage to this approach is that it permits writing directly to submicronic electronic structures with no chemical substitution and no lithography and/or permanent electrodes. The field effect is local, reversible, non-volatile, and non-invasive. This technique has another advantage: it allows the use of a mechanism for detecting reading/writing of ferroelectric domains that is not sensitive to contrast deterioration due to electrostatic passivation.

In practice, it is possible to use any local sensor which will alter the polarization of the ferroelectric material. For example, a tunnel effect microscope may be used to polarize the ferroelectric material if the latter is covered with a sufficiently thin layer of conductive material. Said tunnel effect microscope can also be used to measure and read changes in density of the carriers produced by the electric field, for example, by measuring modifications in tunnel conductive (density of states).

To read small ferroelectric domains, it is possible to use other contrast mechanisms based on the piezoelectric and pyroelectric properties of the ferroelectrics. Much of the same as with the preceding approaches, these techniques would also be subject to passivation.

Figure 3:
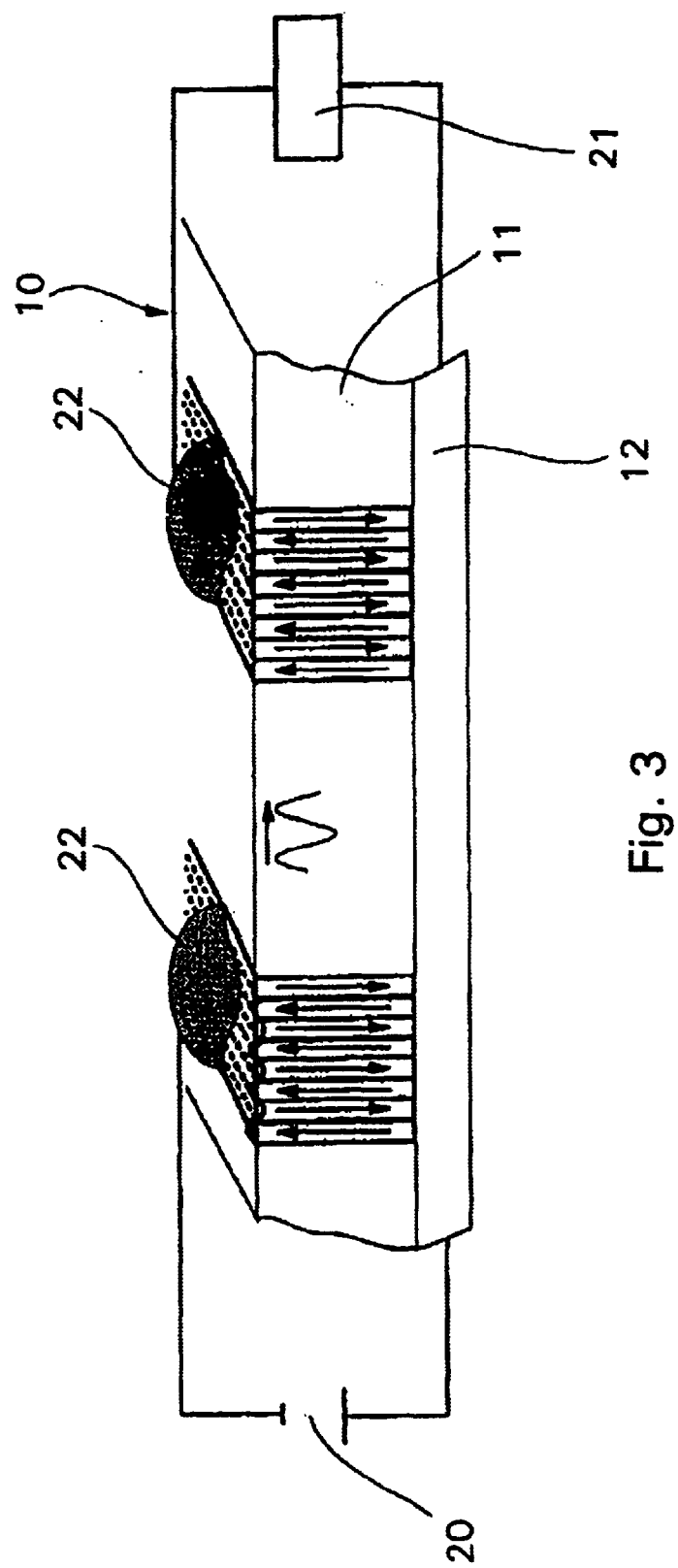
FIG. 3 shows the application of the component as an acoustic surface wave device.

FIG. 3 is a schematic illustration of an application of the component described above as an acoustic surface wave device. Composite structure 10 comprises, in this case, perhaps one layer of ferroelectric material 11 which has been locally polarized, for example, periodically, and a semi-conductor or a thin film of metal or superconductor material 12. An alternating signal uses a piezo-electric effect to provoke a deformation, the sign of which depends upon the polarization, and excites an acoustic surface wave if the frequency of this signal is equal to the speed of the surface wave divided by the wave length.

In devices known in the art, lithographic techniques impose frequency limitations of about 1 Ghz.

A single contact 22 on the structure of the composite surface 10 respectively generates and detects frequencies as high as 20 Ghz and above, using an excitation device 20 and a detector 21.

The device has very high spatial resolution, allowing it to attain elevated techniques that have not been possible using conventional devices with contacts deposited by lithography.

On direct use is as a high frequency filter.

What is claimed is:

1. An electric circuit comprising:
   a composite structure (10) having at least one layer of ferroelectric material (11), with a first surface and an opposed second surface, and a first semi-conductor, metal film or superconductor material (12) layer in contact with the first surface of the layer of ferroelectric material (11); and
   a device for generating local modification in a polarization of the layer of ferroelectric material (11) to one of: (1) locally modify an electronic density of a zone of the first semi-conductor, metal film or superconductor material (12), the zone being near the first surface of the layer of ferroelectric material (11), or (2) create a local deformation in the layer of ferroelectric material (11) to generate an acoustic surface wave;
   the device for generating the local modification in the polarization of the ferroelectric material (11) comprises at least one selective electrode for selectively scanning a second surface of the composite structure (10) and applying at least one of a voltage and a current between the electrode and the semi-conductor, metal film or superconductor material.

2. The circuit according to claim 1, wherein the circuit forms a frequency filter.

3. The circuit according to claim 1, wherein the selective electrode (13) comprises a microscope with a tip as a local sensor.

4. An electric circuit comprising:
   a composite structure (10) having at least one layer of ferroelectric material (11), with a first surface and an opposed second surface, and a first semi-conductor, metal film or superconductor material (12) layer in contact with the first surface of the layer of ferroelectric material (11), and a second semi-conductor, metal film or superconductor material (14) being disposed on the second surface of the layer of ferroelectric material (11); and
   a device for generating local modification in a polarization of the layer of ferroelectric material (11) to one of: (1) locally modify an electronic density of a zone of the first semi-conductor, metal film or superconductor material (12), the zone being near the first surface of the layer of ferroelectric material (11), or (2) create a local deformation in the layer of ferroelectric material (11) to generate an acoustic surface wave.

5. The circuit according to claim 4, wherein the device for generating local modification in the polarization of the layer of ferroelectric material (11) comprises at least one selective electrode (13) for selectively scanning and applying at least one of a voltage and a current from the at least one selective electrode (13) to an exposed surface of the second semi-conductor, metal film or superconductor material (14) of the composite structure (10).

6. The circuit according to claim 4, wherein the selective electrode (13) applies at least one of a voltage and a current to the first semi-conductor, metal film or superconductor material (12) through the layer of ferroelectric material (11).

7. The circuit according to claim 4, wherein at least one of a voltage and a current is applied between the first semi-conductor, metal film or superconductor material (12) and the second semi-conductor, metal film or superconductor material (14).

8. The circuit according to claim 4, wherein the selective electrode (13) comprises a microscope with a tip as a local sensor.

9. The circuit according to claim 4, wherein the selective electrode (13) comprises a particle source for applying excitation energy to the composite structure (10).

10. The circuit according to claim 9, wherein the particle source generates an electron beam for supplying electrons to the composite structure.

11. The circuit according to claim 9, wherein the particle source generates an ion beam for supplying ions to the composite structure.

12. The circuit according to claim 4, wherein the selective electrode (13) comprises of a radiation source for supplying radiation to the composite structure.

13. The circuit according to claim 4, wherein a state of polarization of the layer of ferroelectric material (11) is shown by a characteristic sensitive to local modification in the electronic density of the semi-conductor, the thin film of metal or the superconductor material (12).

14. The circuit according to claim 13, wherein a tunnel conductance is achieved between the selective electrode (13), scanning an exposed surface of the composite structure (10), and one of the first and the second semi-conductor metal film or superconductor materials (12 or 14).

15. The circuit according to claim 4, wherein the device for generating local modification is a frequency filler.

16. The circuit according to claim 4, wherein the circuit is one of a non-volatile memory and an acoustic surface wave device.

17. An electric circuit comprising:
    a composite structure (10) having at least one layer of ferroelectric material (11), with a first surface and an opposed second surface, and a first semi-conductor, metal film or superconductor material (12) layer in contact with the first surface of ferroelectric material (11); and
    a device for generating local modification in a polarization of the layer of ferroelectric material (11) to one of: (1) locally modify an electronic density of a zone of the first semi-conductor, metal film or superconductor material (12), the zone being near the first surface of the layer of ferroelectric material (11), (2) create a local deformation in the layer of ferroelectric material (11) to generate an acoustic surface wave;
    the device for generating the local modification in the polarization of the ferroelectric material (11) comprises at least one selective electrode for selectively scanning a second surface of the composite structure (10);
    wherein the selective electrode (13) comprises a particle source for applying excitation energy to the composite structure (10).

18. The circuit according to claim 17, wherein the particle source generates an electron beam for supplying ions to the composite structure.

19. The circuit according to claim 17, wherein the particle source generates an ion beam for supplying ions to the composite structure.

20. An electric circuit comprising:
    a composite structure (10) having at least one layer of ferroelectric material (11), with a first surface and an opposed second surface, and a first semi-conductor, metal film or superconductor material (12) layer in contact with the first surface of ferroelectric material (11); and a device for generating local modification in a polarization of the layer of ferroelectric material (11) to one of: (1) locally modify an electronic density of a zone of the first semi-conductor, metal film or superconductor material (12), the zone being near the first surface of the layer of ferroelectric material (11), or (2) create a local deformation in the layer of ferroelectric material (11) to generate an acoustic surface wave;

the device for generating the local modification in the polarization of the ferroelectric material (11) comprises at least one selective electrode for selectively scanning a second surface of the composite structure (10);

wherein the selective electrode (13) comprises a radiation source for supplying radiation to the composite structure.

* * * * *